(12) United States Patent
Hwang et al.

(10) Patent No.: US 9,443,968 B2
(45) Date of Patent: Sep. 13, 2016

(54) HIGH ELECTRON MOBILITY TRANSISTORS INCLUDING LIGHTLY DOPED DRAIN REGIONS AND METHODS OF MANUFACTURING THE SAME

(75) Inventors: In-jun Hwang, Hwaseong-si (KR); Jai-kwang Shin, Anyang-si (KR); Jae-joon Oh, Seongnam-si (KR); Jong-seob Kim, Hwaseong-si (KR); Hyuk-soon Choi, Hwaseong-si (KR); Ki-ha Hong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 13/096,573

(22) Filed: Apr. 28, 2011

(65) Prior Publication Data
US 2011/0272743 A1 Nov. 10, 2011

(30) Foreign Application Priority Data

May 4, 2010 (KR) .................. 10-2010-0042083

(51) Int. Cl.

| H01L 29/778 | (2006.01) |
|---|---|
| H01L 29/201 | (2006.01) |
| H01L 29/205 | (2006.01) |
| H01L 29/66 | (2006.01) |
| H01L 29/423 | (2006.01) |

(Continued)

(52) U.S. Cl.
CPC ....... *H01L 29/778* (2013.01); *H01L 21/28008* (2013.01); *H01L 29/1029* (2013.01); *H01L 29/201* (2013.01); *H01L 29/205* (2013.01); *H01L 29/42364* (2013.01); *H01L 29/66431* (2013.01); *H01L 29/66462* (2013.01); *H01L 29/7786* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| 5,550,388 A | 8/1996 | Haruyama |
|---|---|---|
| 5,621,228 A | 4/1997 | Ando |

(Continued)

FOREIGN PATENT DOCUMENTS

| CN | 1554121 A | 12/2004 |
|---|---|---|
| CN | 101604704 | 12/2009 |

(Continued)

OTHER PUBLICATIONS

Song et al, "Normally Off AlGaN/GaN Low-Density Drain HEMT (LDD-HEMT) With Enhanced Breakdown Voltage and Reduced Current Collapse" IEEE, vol. 28, No. 3 (2007): 189-191.*

(Continued)

*Primary Examiner* — Fei Fei Yeung Lopez
(74) *Attorney, Agent, or Firm* — Harness, Dickey & Pierce, P.L.C.

(57) ABSTRACT

High electron mobility transistors (HEMTs) including lightly doped drain (LDD) regions and methods of manufacturing the same. A HEMT includes a source, a drain, a gate, a channel supplying layer for forming at least a 2-dimensional electron gas (2DEG) channel, and a channel formation layer in which at least the 2DEG channel is formed. The channel supplying layer includes a plurality of semiconductor layers having different polarizabilities. A portion of the channel supplying layer is recessed. One of the plurality of semiconductor layers, which is positioned below an uppermost layer is an etching buffer layer, as well as a channel supplying layer.

30 Claims, 8 Drawing Sheets

(51) Int. Cl.
*H01L 21/28* (2006.01)
*H01L 29/10* (2006.01)
*H01L 29/20* (2006.01)

(56) References Cited

U.S. PATENT DOCUMENTS

| | | | |
|---|---|---|---|
| 6,144,049 | A | 11/2000 | Onda |
| 6,448,119 | B1 | 9/2002 | Onda |
| 7,071,499 | B2 | 7/2006 | Bito |
| 7,470,941 | B2 | 12/2008 | Micovic et al. |
| 7,598,131 | B1 | 10/2009 | Micovic et al. |
| 2002/0017648 | A1* | 2/2002 | Kasahara et al. ............... 257/79 |
| 2002/0119610 | A1* | 8/2002 | Nishii et al. ................... 438/167 |
| 2003/0015777 | A1 | 1/2003 | Benedix et al. |
| 2003/0218183 | A1* | 11/2003 | Micovic et al. ............. 257/192 |
| 2004/0104404 | A1 | 6/2004 | Bito |
| 2005/0274980 | A1 | 12/2005 | Miyoshi |
| 2006/0157729 | A1* | 7/2006 | Ueno et al. .................... 257/103 |
| 2007/0018198 | A1* | 1/2007 | Brandes et al. ............. 257/183 |
| 2007/0295993 | A1 | 12/2007 | Chen et al. |
| 2009/0057720 | A1* | 3/2009 | Kaneko .......................... 257/194 |
| 2009/0121217 | A1* | 5/2009 | Iwakami ........... H01L 29/42316 257/40 |
| 2010/0001297 | A1 | 1/2010 | Takashima et al. |
| 2010/0012977 | A1* | 1/2010 | Derluyn et al. .............. 257/194 |
| 2010/0219452 | A1* | 9/2010 | Brierley ........................ 257/194 |
| 2011/0089468 | A1 | 4/2011 | Zhang |

FOREIGN PATENT DOCUMENTS

| | | |
|---|---|---|
| CN | 101604704 A | 12/2009 |
| TW | 200707740 A | 2/2007 |
| WO | WO-2007/018653 A2 | 2/2007 |

OTHER PUBLICATIONS

Pearton et al "GaN: Processes, defects and devices" J. Appl. Phys. 86 (1), 1999.*
"Polarization Effects, Surface States, and the Source of Electrons in AlGaN/GaN Heterostructure Field Effect Transistors", J.P. Ibbetson et al., Published Jul. 10, 2000, Applied Physics Letters, vol. 77, No. 2, pp. 250-252.
"A Normally-off GaN FET With High Threshold Voltage Uniformity Using a Novel Piezo Neutralization Technique", K. Ota et al., 2009, Nano Electronics Research Laboratories, NEC Corporation.
Wataru Saito et al., "Recessed-Gate Structure Approach Toward Normally Off High-Voltage AlGaN/GaN HEMT for Power Electronics Applications", 2006 IEEE, pp. 356-362.
Dec, 17, 2014 Chinese Office Action issued in corresponding Chinese Application No. 201110113377.4 (with translation).
Chinese Office Action dated May 22, 2015 issued in corresponding Chinese Patent Application No. 201110113377.4.
Korean Office Action dated Mar. 3, 2016 issued in corresponding Korean Application No. 10-2010-0042083 (English translation provided).

\* cited by examiner

HIGH ELECTRON MOBILITY TRANSISTORS INCLUDING LIGHTLY DOPED DRAIN REGIONS AND METHODS OF MANUFACTURING THE SAME

CROSS-REFERENCE TO RELATED APPLICATION

This application claims priority under 35 U.S.C. §119 to Korean Patent Application No. 10-2010-0042083, filed on May 4, 2010, in the Korean Intellectual Property Office (KIPO), the entire contents of which is incorporated herein by reference.

BACKGROUND

1. Field

Example embodiments relate to power devices, and more particularly, to high electron mobility transistors (HEMTs) including lightly doped drain (LDD) regions and methods of manufacturing the same.

2. Description of the Related Art

A high electron mobility transistor (HEMT) may include semiconductors with different band gaps joined together. A semiconductor with a relatively wide band gap (e.g., a compound semiconductor) functions as a donor and forms a 2-dimensional electron gas (2DEG) in a semiconductor with a relatively narrow band gap. A 2DEG may be formed by doping an n-type material into a material having a relatively wide band gap and/or by using a polarized material. The 2DEG may be used as a channel with increased electron mobility. A HEMT may be a transistor with high breakdown voltage and may be used as a power device.

SUMMARY

Provided are reliable and/or improved high electron mobility transistors (HEMTs) including lightly doped drain (LDD) regions, and methods of manufacturing the HEMTs.

According to example embodiments, a high electron mobility transistor (HEMT) includes a source, a drain, a gate, a channel supplying layer for forming at least a 2-dimensional electron gas (2DEG) channel and a channel formation layer in which at least the 2-dimensional electron gas (2DEG) channel is to be formed by the channel supplying layer. The channel supplying layer includes a plurality of semiconductor layers having different polarizabilities. The channel supplying layer includes a recessed portion, and one of the plurality of semiconductor layers, which is positioned below an uppermost layer is an etching buffer layer, as well as a channel supplying layer.

The channel supplying layer may include a buffer layer and an upper layer which are sequentially stacked, and polarizability of the upper layer may be greater than polarizability of the buffer layer. The HEMT may further include a barrier layer disposed below the buffer layer. Polarizability of the barrier layer may be greater than polarizability of the buffer layer. The recessed portion may be a portion of the upper layer, which is completely removed, or a completely removed portion of the upper layer and a partially removed portion of the buffer layer. The recess may be a portion of the upper layer, which is completely removed, or a completely removed portion of the upper layer and a partially removed portion of the buffer layer.

The gate may be disposed in the recessed portion of the channel supplying layer, or is disposed around the recessed portion. A portion of the channel supplying layer in which the recessed portion is disposed may include an oxidized region. The oxidized region may extend into an entire region of the recessed portion. The HEMT may further include a channel increasing layer disposed on the channel supplying layer between the source, the drain and the gate. The HEMT may further include an insulating layer disposed between the gate and the channel supplying layer. The HEMT may further include an insulating layer disposed on the channel increasing layer. The HEMT may further include a p-type dielectric layer disposed between the gate and the channel supplying layer.

According to other example embodiments, a method of manufacturing a high electron mobility transistor (HEMT) includes forming a channel formation layer in which at least a 2-dimensional electron gas (2DEG) channel is to be formed, forming a channel supplying layer for forming the 2DEG channel in the channel formation layer, on the channel formation layer, forming a recess in the channel supplying layer, and forming a source, a drain and a gate after or before the recess is formed. The channel supplying layer includes a plurality of semiconductor layers having different polarizabilities, and one of the plurality of semiconductor layers, which is positioned below an uppermost layer is an etching buffer layer, as well as a channel supplying layer.

According to still other example embodiments, a method of manufacturing a high electron mobility transistor (HEMT) includes forming a channel formation layer in which at least the 2-dimensional electron gas (2DEG) channel is to be formed, forming a channel supplying layer for forming the 2DEG channel in the channel formation layer, on the channel formation layer, forming a recess on the channel supplying layer, and forming a source, a drain and a gate after or before the recess is formed. The channel supplying layer includes a plurality of semiconductor layers having different polarizabilities, and one of the plurality of semiconductor layers, which is positioned below an uppermost layer is an etching buffer layer, as well as a channel supplying layer.

The forming of the channel supplying layer may include forming a buffer layer on the channel formation layer and forming an upper layer having greater polarizability than polarizability of the buffer layer, on the buffer layer. The method may further include forming a barrier layer having greater polarizability than polarizability of the buffer layer, below the buffer layer. The forming of the recess may include completely removing a portion of the upper layer or completely removing a portion of the upper layer, and then partially removing a portion of the buffer layer. The gate may be formed on the recess of the channel supplying layer, or around the recess.

The method may further include forming a channel increasing layer on the channel supplying layer between the source, the drain and the gate. The method may further include forming an insulating layer between the gate and the channel supplying layer. The method may further include forming an insulating layer on the channel increasing layer. The method may further include forming a p-type dielectric layer between the gate and the channel supplying layer. The channel increasing layer may be formed of any one selected from the group consisting of carbon (C), silicon (Si), germanium (Ge), CN, SiN, GeN and a n-type dielectric material. In this case, the channel increasing layer may be formed of a compound of C, Si and Ge, and nitrides of the compound.

In the HEMT, one of the layers included in the channel supplying layer may be an etching buffer layer or may be an etching buffer layer, and simultaneously a layer for supplying a channel. In these cases, a change in polarizability according to a change in a thickness of a layer may be small. During the formation of the HEMT, the etching buffer layer may be used as a layer for blocking etching in order to form a LDD region in a 2DEG channel, and a significant change in the concentration of electrons contained in the 2DEG channel according to an etching thickness of the channel supplying layer may be prevented and/or reduced during the formation of the LDD region. The reliability of the LDD region and the reliability of reproducibility of the HEMT may be ensured. In addition, a margin of an etching operation for forming the LDD region may be increased since the channel supplying layer is an etching buffer layer, and simultaneously is a layer for supplying a channel.

According to further example embodiments, a high electron mobility transistor (HEMT) includes a channel supplying layer configured to induce a 2-dimensional electron gas (2DEG) channel, the channel supplying layer including a plurality of semiconductor layers with different polarizabilities, a first semiconductor layer of the plurality of semiconductor layers configured to be an etch buffer layer and to induce at least a part of the 2DEG, the channel supplying layer including a recessed region, a channel formation layer configured to include the 2DEG channel induced by the channel supplying layer, and a source, a drain and a gate on the channel supplying layer.

According to still further example embodiments, a method of manufacturing a high electron mobility transistor (HEMT) includes forming a channel formation layer, forming a channel supplying layer on the channel formation layer to induce a 2-dimensional electron gas (2DEG) channel in the channel formation layer, the channel supplying layer including a plurality of semiconductor layers with different polarizabilities, a first semiconductor layer of the plurality of semiconductor layers formed as an etch buffer layer and to induce at least part of the 2DEG, forming a recess in the channel supplying layer and forming a source, a drain and a gate on the channel supplying layer.

BRIEF DESCRIPTION OF THE DRAWINGS

Example embodiments will be more clearly understood from the following brief description taken in conjunction with the accompanying drawings. FIGS. 1-11 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In a high electron mobility transistor (HEMT), a 2DEG between a gate and a drain may be removed during a turning-off operation (e.g., depletion mode). A space charge may remain and an electric field may be concentrated at the gate due to the space charge. Due to the concentration of the electric field at the gate, the breakdown voltage of the HEMT may decrease. In order to increase the breakdown voltage, the polarizability of a channel supplying layer may be reduced, and/or acceptors may be supplied to the channel supplying layer to reduce the concentration of electrons contained in a 2DEG channel. It may be difficult to control the concentration of electrons contained in a 2DEG channel.

A channel supplying layer is a layer by which 2DEG is formed. The 2DEG is formed by the channel supplying layer. The concentration of electrons contained in a 2DEG channel may be sensitive to a change in the thickness and the polarizability of the channel supplying layer. As the thickness of the channel supplying layer is reduced, a deviation in the concentration of electrons contained in a 2DEG channel according to a change in the thickness of the channel supplying layer may be further increased. It may not be easy to reliably form a LDD region having the relatively small concentration of electrons contained in the 2DEG channel compared to the remaining region of the 2DEG channel. Lightly doped drain regions as used herein may refer to a carrier concentration in a 2DEG channel region and not necessarily to elemental doping of a material.

Figure 1:
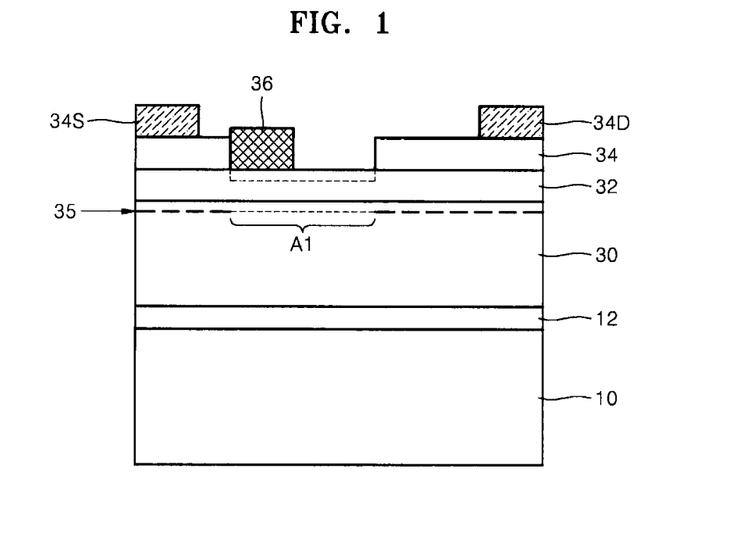
FIGS. 1-8 are cross-sectional diagrams illustrating high electron mobility transistors (HEMT) according to example embodiments.

FIG. 1 is a cross-sectional diagram illustrating a HEMT according to example embodiments. Referring to FIG. 1, a buffer layer 12 may be on a substrate 10. The substrate 10 may be, for example, a sapphire substrate. For example, the buffer layer 12 may be an AlN layer and/or an AlGaN layer. A first material layer 30 and a second material layer 32 may be on the buffer layer 12 (e.g., sequentially stacked). The first material layer 30 and the second material layer 32 may each be a semiconductor layer with different polarizabilities and different band gaps. The polarizability and/or band gap of the first material layer 30 may be less than the polarizability and/or band gap of the second material layer 32. The first material layer 30 may be a semiconductor layer, for example, a GaN layer, an InGaN layer, and/or AlGaN layer/GaN layer. The first material layer 30 may include a 2-dimensional electron gas (2DEG) channel 35. The 2DEG channel 35 may include a lightly doped drain (LDD) region A1. The concentration of electrons contained in the LDD region A1 may be less than the concentration of electrons contained in the remaining portion of the 2DEG channel 35.

The second material layer 32 and a third material layer 34 may be on the first material layer 30 (e.g., sequentially stacked). The second material layer 32 and the third material layer 34 may be part of a channel supplying layer for inducing the 2DEG channel 35 in the first material layer 30. The 2DEG channel 35 in the first material layer 30 may be induced by the second material layer 32 and the third material layer 34. The third material layer 34 may be an upper layer. The second material layer 32 may be an etch buffer layer and/or a buffer layer. A set of the second material layer 32 and the third material layer 34 may be referred to as a first channel supplying layer.

The first channel supplying layer may be a semiconductor layer having greater polarizability than that of the first material layer 30. The first channel supplying layer may be polarized according to a polarizability difference between the first channel supplying layer and the first material layer 30. Due to the polarization of the first channel supplying layer, a 2DEG may be formed under a contact surface of the first material layer 30 with the first channel supplying layer, for example, the second material layer 32 of the first channel supplying layer. The 2DEG channel 35 may be induced in the first material layer 30. Because the 2DEG channel 35 is induced in the first material layer 30 by the first channel supplying layer, the first material layer 30 may be referred to as a channel formation layer.

The second material layer 32 and the third material layer 34 may have different polarizabilities. For example, the polarizability of the third material layer 34 may be greater than the polarizability of the second material layer 32. A change in the polarizability of the second material layer 32 according to a change in the thickness of the second material layer 32 may not be great. A change in the concentration of electrons contained in the 2DEG, for example, a reduction in the concentration of electrons contained in the 2DEG according to a change in the thickness of the second material layer 32 (e.g., a reduction of the thickness of the second material layer 32) may not be great. During the manufacture of the HEMT of FIG. 1, when the second material layer 32 is used as an etch-stop layer during an etch operation for forming the LDD region A1, the LDD region A1 may have a uniform concentration of electrons within an allowable deviation (e.g., manufacturing tolerance). A reliable and/or improved LDD region A1 may be formed.

The second material layer 32 may be an etch buffer layer functioning as a buffer during the etching operation, as well as a layer for supplying the 2DEG channel to the LDD region A1. The second material layer 32 and the third material layer 34 may be formed of about the same material and/or different materials. For example, the second material layer 32 and the third material layer 34 may be an AlGaN layer, an AlN layer and/or an AlInN layer. When the second material layer 32 and the third material layer 34 are formed of about the same material, the second material layer 32 and the third material layer 34 may be of different compositions and/or components. For example, when both the second material layer. 34 are each an AlGaN layer, the third material layer 34 with greater polarizability than the second material layer 32 may include a greater ratio of aluminum (Al) than that of the second material layer 32.

The thickness of the second material layer 32 may be, for example, about 1 to about 100 nm or greater. The third material layer 34 may be on only a portion of the second material layer 32. The third material layer 34 may not be on a portion of the second material layer 32 corresponding to the LDD region A1. The 2DEG of the LDD region A1 may be generated by the second material layer 32. The thickness of the third material layer 34 may be, for example, about 1 to about 100 nm or greater. An upper portion of the second material layer 32 corresponding to the LDD region A1 may be removed as illustrated in FIG. 1 by dotted lines.

A source 34S and a drain 34D may be on the third material layer 34. The source 34S and the drain 34D face each other with respect to the LDD region A1. A gate 36 may be on a portion of the second material layer 32 corresponding to the LDD region A1, between portions of the third material layer 34. The gate 36, and the source 34S and the drain 34D, may be of different materials.

Figure 2:
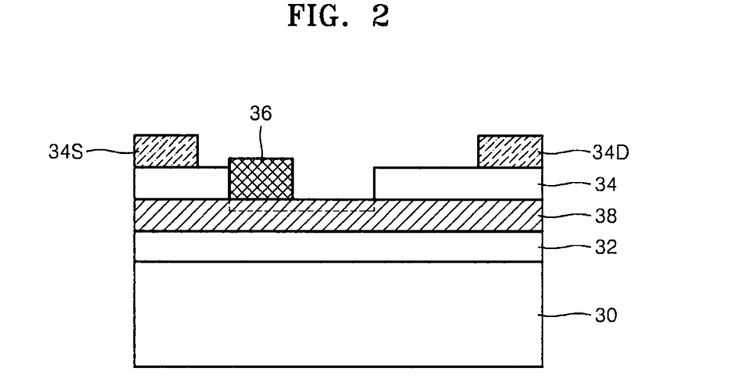

FIG. 2 is a cross-sectional diagram of a HEMT according to other example embodiments. For convenience of description, a substrate 10 and a buffer layer 12 are not illustrated in FIG. 2. Like reference numerals in the drawings denote like elements and their description may be omitted. Referring to FIG. 2, an intermediate material layer 38 may be on the second material layer 32. A set of the intermediate material layer 38, the second material layer 32 and the third material layer 34 may be a second channel supplying layer. The thickness of the intermediate material layer 38 may be, for example, about 1 to about 100 nm. A buffer layer and/or an etching buffer layer may be the intermediate material layer 38. The second material layer 32 may be a barrier layer and may generate a 2DEG in the LDD region A1. A barrier layer may increase an on-current and decrease a gate leakage of a HEMT when a gate is turned on.

Although the intermediate material layer 38 may function as an etch buffer layer, when the intermediate material layer 38 is a semiconductor having polarizability, the intermediate material layer 38 together with the second material layer 32 may facilitate generation of the 2DEG in the LDD region A1. The intermediate material layer 38 may be a semiconductor layer having polarizability and/or an etch buffer layer without polarizability. When the intermediate material layer 38 is a semiconductor layer with polarizability, the intermediate material layer 38, and the second and/or third material layers 32 and 34, may be about the same material, but may have different compositions and/or components.

The polarizability of the intermediate material layer 38 may be less than that of each of the second material layer 32 and the third material layer 34. The polarizability of the second material layer 32 as a barrier layer may be greater than the polarizability of the third material layer 34. The third material layer 34, the source 34S, the drain 34D and the gate 36 may be on the intermediate material layer 38. The positional relationship between the third material layer 34, the source 34S, the drain 34D and the gate 36, and intermediate material layer 38 may be the same or similar to the positional relationship between the second material layer 32 and the third material layer 34, the source 34S, the drain 34D and the gate 36 of FIG. 1.

Figure 3:
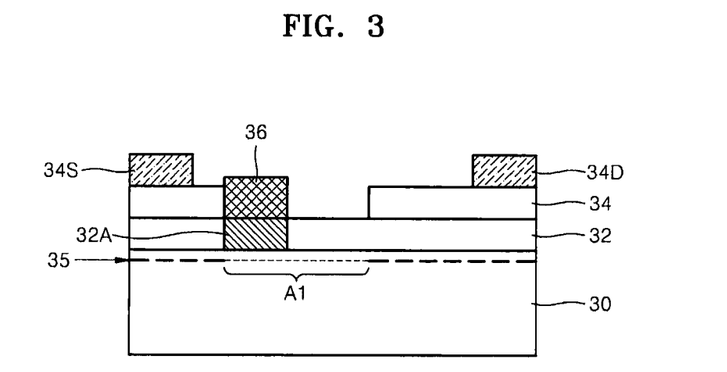

FIG. 3 is a cross-sectional diagram of a HEMT according to still other example embodiments. Referring to FIG. 3, the positional relationship between the second material layer 32 and the third material layer 34, and the gate 36, the source 34S and the drain 34D may be the same or similar to that of FIG. 1. The second material layer 32 may include an oxidized region 32A formed below the gate 36. According to example embodiments, the oxidized region 32A may be between the gate and the LDD region A1 and/or may extend through the entire region of the second material layer 32 corresponding to the LDD region A1. The oxidized region 32A may contain oxygen. The oxidized region 32A may be formed by oxidizing a portion of the second material layer 32 corresponding to the oxidized region 32A, and/or may be formed by containing oxygen ions as acceptors in the oxidized region 32A.

The polarizability of the oxidized region 32A may be less than the polarizability of the remaining portion of the second material layer 32. A polarizability difference between the oxidized region 32A and the first material layer 30 may be less than a polarizability difference between the second material layer 32 and the first material layer 30. The concentration of electrons contained in the 2DEG channel 35 of the first material layer 30 below the gate 36 may decrease. When the oxidized region 32A contains oxygen ions as acceptors, electrons contained in the 2DEG channel 35 may be accepted by the oxygen ions and the concentration of electrons contained in the 2DEG channel of the first material layer 30 below the gate 36 may decrease.

Figure 4:
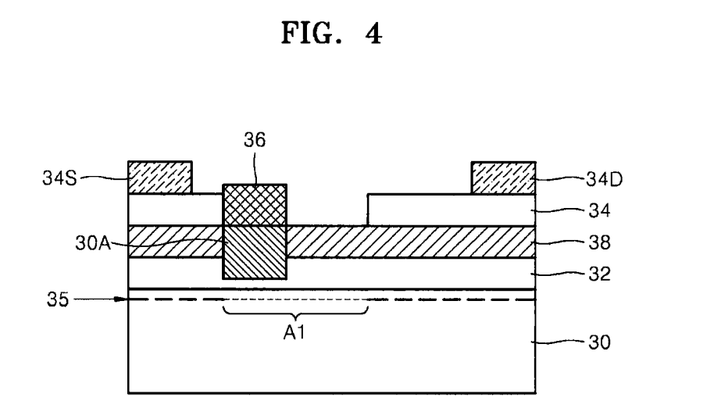

FIG. 4 is a cross-sectional view of a HEMT according to further example embodiments. Referring to FIG. 4, the HEMT of FIG. 4 may be similar to the HEMT of FIG. 2. The HEMT of FIG. 4 may include an oxidized region 30A on a portion of the intermediate material layer 38 corresponding to the LDD region A1. The oxidized region 30A may be the same or similar to the oxidized region 32A described with respect to FIG. 3. The oxidized region 30A may extend into a portion of a second material layer 32. The oxidized region 30A may extend into other portions of the intermediate material layer 38 and the second material layer 32 corresponding to the LDD region A1. A same or similar effect to a case where the oxidized regions 32A and 30A described with respect to FIGS. 3 and 4 are used may be obtained by, for example, doping portions corresponding to the oxidized regions 32A and 30A with p-type impurities and/or disposing a p-type dielectric layer (not shown but refer to FIG. 13 below) between the gate 36 and a material formed directly below the gate 36.

Figure 5:
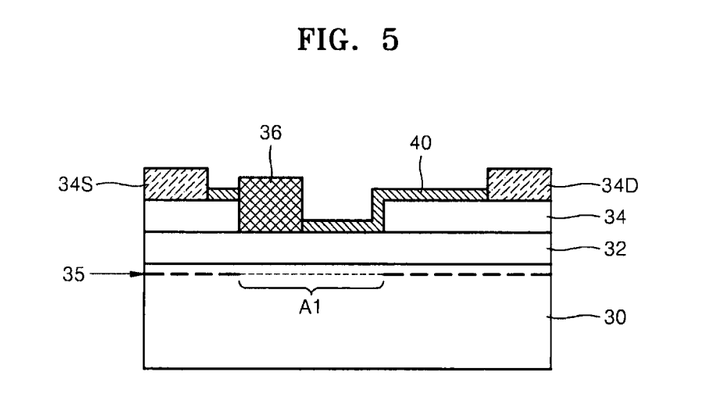
Figure 6:
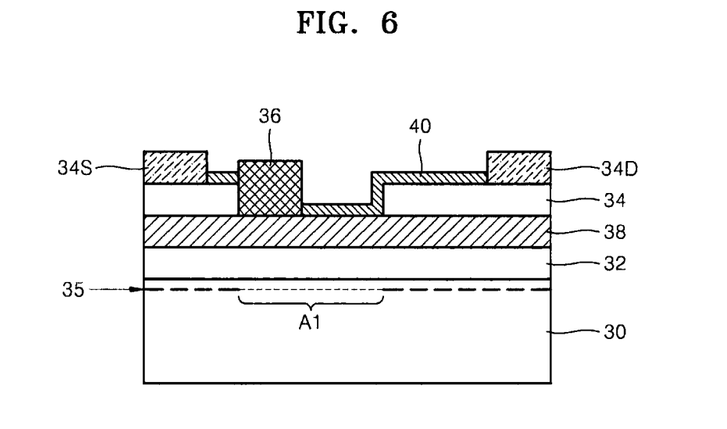

FIG. 5 is a cross-sectional diagram of a HEMT according to yet other example embodiments. Referring to FIG. 5, the HEMT of FIG. 5 may be similar to the HEMT of FIG. 1. Exposed upper surfaces of the second material layer 32 and the third material layer 34 may be covered by a channel increasing layer 40. The channel increasing layer 40 may increase the carrier concentration of the 2DEG in the channel 35. The channel increasing layer 40 may include, for example, one of carbon (C), silicon (Si), germanium (Ge), CN, SiN, GeN and a n-type dielectric material. The channel increasing layer may be, for example, a compound of C, Si and Ge, and nitrides of the compound. FIG. 6 is a cross-sectional diagram of a HEMT according to yet further example embodiments. Referring to FIG. 6, the HEMT of FIG. 6 may be similar to the HEMT of FIG. 2. Exposed upper surfaces of the intermediate material layer 38 and the third material layer 34 may be covered by a channel increasing layer 40.

Figure 7:
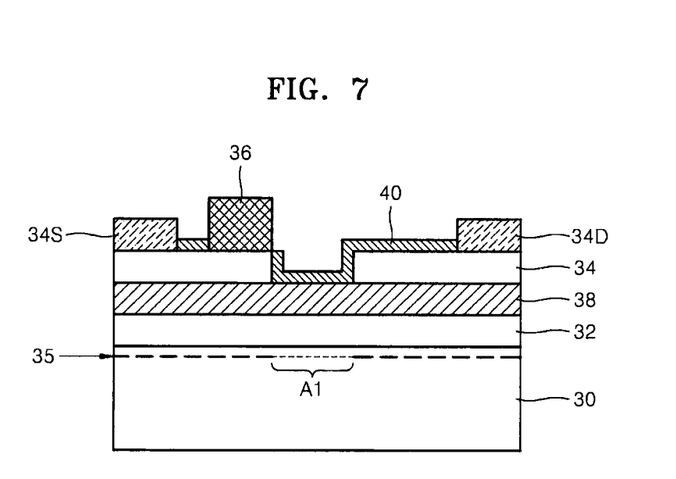

FIG. 7 is a cross-sectional diagram of a HEMT according to still further example embodiments. Referring to FIG. 7, the HEMT of FIG. 7 may be similar to the HEMT of FIG. 6. A gate 36 may be on a region of a third material layer 34 adjacent to the LDD region A1. The gate 36 may be adjacent to the source 34S, and the gate 36 and the drain 34D may face each other with respect to the LDD region A1. A location of the gate 36 of FIG. 7 may be applied to example embodiments described with respect to FIGS. 1-5.

Figure 8:
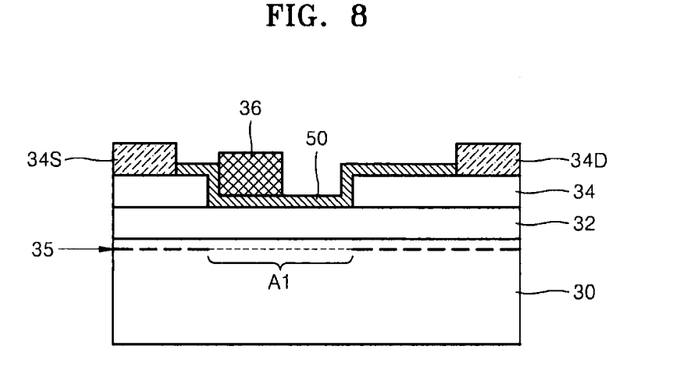

FIG. 8 is a cross-sectional view of a HEMT according to still yet further example embodiments. Referring to FIG. 8, the HEMT of FIG. 8 may be similar to the HEMT of FIG. 1. An insulating layer 50 may be between the gate 36 and the second material layer 32. The insulating layer 50 may extend to the source 34S and the drain 34D. The insulating layer 50 may increase an on-current of the HEMT. The insulating layer 50 may be, for example, an $Al_2O_3$ layer, a $SiO_2$ layer and/or a SiN layer. A thickness of the insulating layer 50 may be, for example, about 1 to about 50 nm. A case where the insulating layer 50 is between the gate 36 and a material layer adjacent to the gate 36 may be applied to example embodiments described with respect to FIGS. 2-7.

Figure 9:
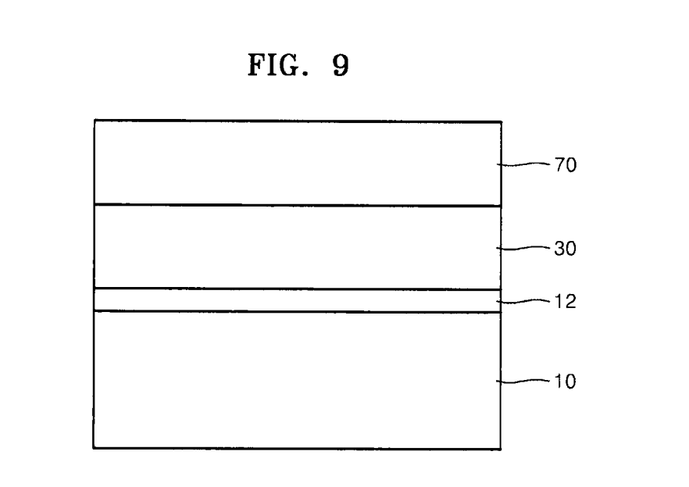
FIGS. 9-11 are cross-sectional diagrams illustrating methods of manufacturing HEMTs according to example embodiments.
Figure 10:
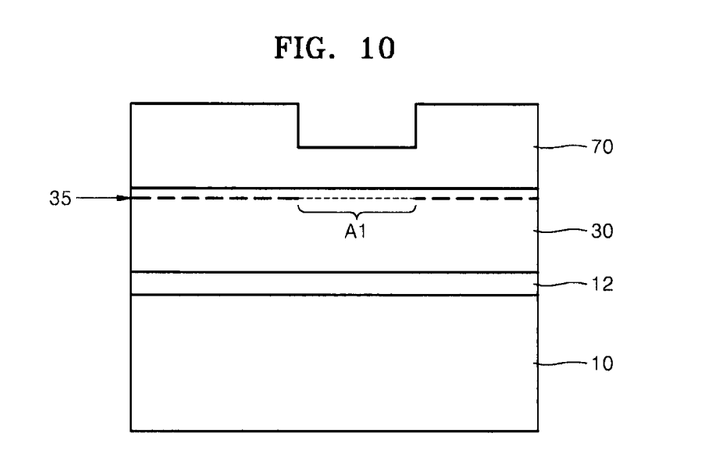
Figure 11:
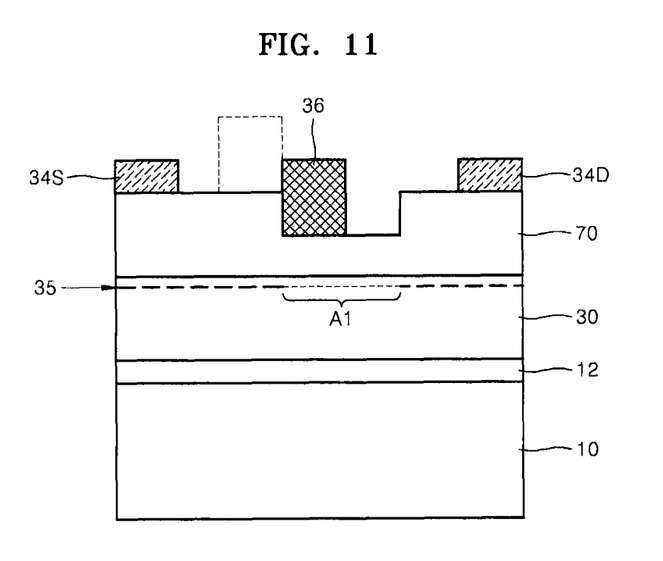

FIGS. 9-11 are cross-sectional diagrams illustrating methods of manufacturing HEMTs according to example embodiments. Referring to FIG. 9, a buffer layer 12 may be formed on a substrate 10. A first material layer 30 may be formed on the buffer layer 12. A channel supplying layer 70 may be formed on the first material layer 30. The channel supplying layer 70 may include a plurality of layers, and may include materials described with reference to FIGS. 1-8. For example, the channel supplying layer 70 may include the second material layer and the intermediate material layer of FIGS. 1 and 2, and may include the third material layer 34 and the channel increasing layer 40 of FIG. 5.

Referring to FIG. 10, a portion of the channel supplying layer 70 corresponding to an LDD region A1 may be removed. The channel supplying layer 70 may include a recessed region and the LDD region A1 may be formed in the first material layer 30. A thickness of the removed portion of the channel supplying layer 70 may be the entire thickness of the portion of the third material layer 34 corresponding to the LDD region A1, the entire thickness of the portion of the third material layer 34 and a partial thickness of the second material layer 32, the entire thickness of the portion of the third material layer 34 and a partial thickness of the intermediate material layer 38, or a partial thickness of the portion of the third material layer 34 corresponding to the LDD region A1.

Referring to FIG. 11, the source 34S, the drain 34D and the gate 36 may be formed on the channel supplying layer 70. As one example, the gate 36 may be formed after the source 34S and the drain 34D are formed. The gate 36 may be formed on the removed portion of the channel supplying layer 70. As indicated by in FIG. 11 by dotted lines, the gate 36 may be formed on an upper portion of the channel supplying layer 70 adjacent to the LDD region A1. According to whether heat treatment is required, the source 34S, the drain 34D and the gate 36 may be formed after or before the LDD region A1 is formed. An insulating layer 50 (e.g., as illustrated in FIG. 8) may be formed between the gate 36 and the channel supplying layer 70. A channel increasing layer 40 (e.g., as illustrated in FIGS. 5-7) may be formed on the channel supplying layer 70 between the gate 36, and the source 34S and the drain 34D. An oxidized region 32A and/or 30A (e.g., as illustrated in FIGS. 3 and 4) may be formed in a region of the channel supplying layer 70 below the gate 36.

Figure 12:
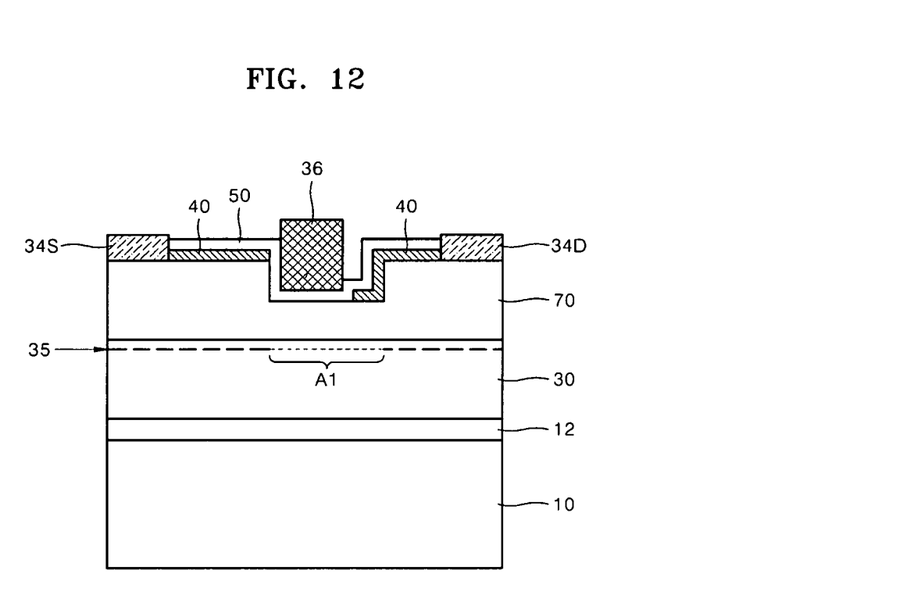
FIG. 12 is a cross-sectional diagram illustrating a high electron mobility transistor (HEMT) according to example embodiments.

FIG. 12 is a cross-sectional diagram illustrating a high electron mobility transistor (HEMT) according to example embodiments.

Referring to FIG. 12, according to example embodiments, a HEMT may be the same as the HEMT illustrated in FIG. 11, except a channel increasing layer 40 may be on the channel supplying layer 70 between the gate 36 and the source 34S and between the gate 36 and the drain 34S. Additionally, an insulating layer 50 may be on the channel increasing layer 40. The insulating layer 50 may be formed between the gate 36 and the channel supplying layer 70.

Figure 13:
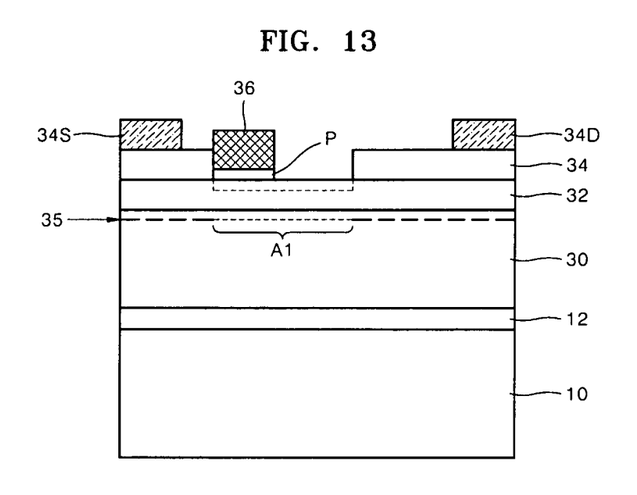
FIG. 13 is a cross-sectional diagram illustrating a high electron mobility transistor (HEMT) according to example embodiments.

FIG. 13 is a cross-sectional diagram illustrating a high electron mobility transistor (HEMT) according to example embodiments.

Referring to FIG. 13, according to example embodiments, a HEMT may be the same as the HEMT illustrated in FIG. 1, except a p-type dielectric layer may be between the gate 36 and the channel supplying layer 32/34.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
   a channel supplying layer configured to induce a 2-dimensional electron gas (2DEG) channel, the channel supplying layer including a plurality of semiconductor layers with different polarizabilities, a first semiconductor layer of the plurality of semiconductor layers configured to be an etch buffer layer and to induce at least a part of the 2DEG channel, a second semiconductor layer of the plurality of semiconductor layers on the first semiconductor layer, the polarizability of the second semiconductor layer being greater than the polarizability of the first semiconductor layer, the second semiconductor layer including a first sidewall opposite a second sidewall that define at least an uppermost part of a recessed region of the channel supplying layer;
   a channel formation layer configured to include the 2DEG channel induced by the channel supplying layer;
   a source, a drain and a gate on the channel supplying layer,
   the gate being closer to the first sidewall of the second semiconductor layer than the second sidewall of the second semiconductor layer,
   the gate being one of on and adjacent to the recessed region, and
   a side of the gate being one of coplanar with the first sidewall of the second semiconductor layer and contacting the first sidewall of the second semiconductor layer; and
   a channel increasing layer on the channel supplying layer between the gate and the source, and between the gate and the drain, the channel increasing layer extending into the recessed region.

2. The HEMT of claim 1, wherein the first semiconductor layer is on the channel formation layer.

3. The HEMT of claim 2, wherein
   a third semiconductor layer of the plurality of semiconductor layers is between the first semiconductor layer and the channel formation layer, the third semiconductor layer is configured to be a barrier layer, and the polarizability of the third semiconductor layer is greater than the polarizability of the first semiconductor layer.

4. The HEMT of claim 2, wherein sidewalls of the recessed region extend from a surface of the channel supplying layer through one of the entire second semiconductor layer, and the entire second semiconductor layer and part of the first semiconductor layer.

5. The HEMT of claim 3, wherein sidewalls of the recessed region extend from a surface of the channel supplying layer through one of the entire second semiconductor layer, and the entire second semiconductor layer and part of the first semiconductor layer.

6. The HEMT of claim 1, further comprising:

an oxidized region between a bottom surface of the gate and an upper surface of at least one of the first semiconductor layer and the channel formation layer, the oxidized region defined by an oxidized part of an AlN layer or an AlInN layer in the channel supplying layer, wherein the first semiconductor layer is formed of AlN or AlInN, the oxidized region is defined by an oxidized part of the first semiconductor layer as the oxidized part of the AlN layer or the AlInN layer in the channel supplying layer, and the oxidized region is between the recessed region and the channel formation layer.

7. The HEMT of claim 6, wherein the oxidized region is between the bottom surface of the gate and the upper surface of the channel formation layer, and the oxidized region extends an entire thickness of the channel supplying layer between the recessed region and the channel formation layer.

8. The HEMT of claim 1, further comprising: an insulating layer between the bottom surface of the gate and the upper surface of the channel formation layer.

9. The HEMT of claim 1, further comprising:

an insulating layer between the bottom surface of the gate and the upper surface of the channel formation layer, and the insulating layer is on the channel increasing layer.

10. The HEMT of claim 1, further comprising:

a p-type dielectric layer between the gate and the channel supplying layer.

11. The HEMT of claim 6, further comprising:

an insulating layer between the bottom surface of the gate and the upper surface of the channel formation layer.

12. A method of manufacturing a high electron mobility transistor (HEMT), the method comprising:

forming a channel formation layer;

forming a channel supplying layer on the channel formation layer to induce a 2-dimensional electron gas (2DEG) channel in the channel formation layer, the channel supplying layer including a plurality of semiconductor layers with different polarizabilities, a first semiconductor layer of the plurality of semiconductor layers formed as an etch buffer layer and configured to induce at least part of the 2DEG channel, a second semiconductor layer of the plurality of semiconductor layers on the first semiconductor layer, the polarizability of the second semiconductor layer being greater than the polarizability of the first semiconductor layer;

forming a recess in the channel supplying layer, the forming the recess in the channel supplying layer including forming a first sidewall opposite a second sidewall in the second semiconductor layer, the first and second sidewalls of the second semiconductor layer defining at least an uppermost part of the recessed region of the channel supplying layer;

forming a source, a drain and a gate on the channel supplying layer, the gate being closer to the first sidewall of the second semiconductor layer than the second sidewall of the second semiconductor layer, the gate includes forming the gate one of on and adjacent to the recess region, and a side of the gate being one of coplanar with the first sidewall of the second semiconductor layer and contacting the first sidewall of the second semiconductor layer; and forming a channel increasing layer on the channel supplying layer between the gate and the source, and between the gate and the drain, the channel increasing layer extending into the recessed region.

13. The method of claim 12, further comprising:

forming a buffer layer;

wherein the forming of the channel supplying layer includes forming the second semiconductor layer on the buffer layer, the polarizability of the second semiconductor layer greater than the polarizability of the buffer layer.

14. The method of claim 13, further comprising:

forming a barrier layer with a greater polarizability than the first semiconductor layer between the first semiconductor layer and the channel formation layer.

15. The method of claim 13, wherein the forming of the recess includes one of completely removing a portion of the second semiconductor layer, and completely removing a portion of the second semiconductor layer and partially removing a portion of the first semiconductor layer.

16. The method of claim 14, wherein the formation of the recess includes one of completely removing a portion of the second semiconductor layer, and completely removing a portion of the second semiconductor layer and partially removing a portion of the first semiconductor layer.

17. The method of claim 12, further comprising:

forming an oxidized region between a bottom surface of the gate and an upper surface of at least one of the first semiconductor layer and the channel formation layer, wherein the forming the oxidized region includes oxidizing a part of an AlN layer or an AlInN layer in the channel supplying layer, the first semiconductor layer is formed of AlN or AlInN, and the method includes the forming the oxidized region by oxidizing a part of the first semiconductor layer as the part of the AlN layer or the AlInN layer in the channel supplying layer forming the recess.

18. The method of claim 12, further comprising:

forming an insulating layer between the bottom surface of the gate and the upper surface of the channel supplying layer.

19. The method of claim 12, wherein the method includes the forming the insulating layer between the bottom surface of gate and the upper surface of the channel supplying layer, and the forming the insulating layer includes forming the insulating layer on the channel increasing layer.

20. The method of claim 12, wherein
the method includes the forming the p-type dielectric layer between the gate and the channel supplying layer.

21. The method of claim 17, further comprising:
forming an insulating layer between the bottom surface of the gate and the upper surface of the channel formation layer.

22. The HEMT of claim 1, further comprising:
a buffer layer, wherein
the channel formation layer is on the buffer layer, and a composition of the buffer layer is different than a composition of the first semiconductor layer.

23. The HEMT of claim 1,
the first and second sidewall of the second semiconductor layer define the recessed region and expose a portion of the first semiconductor layer,
the exposed portion of the first semiconductor layer is configured to induce a lightly doped drain (LDD) region in the 2DEG channel, and
the gate is closer to one of the first and second sidewalls of the second semiconductor layer than an other of the first and second sidewalls of the second semiconductor layer.

24. The method of claim 12, further comprising:
forming a buffer layer using a material that is a different composition than a composition of the first semiconductor layer, wherein
the forming the channel formation layer includes forming the channel formation layer on the buffer layer.

25. The method of claim 12, wherein
the forming the recess includes forming the first and the second sidewalls of the second semiconductor layer to expose a portion of the first semiconductor layer, and
the exposed portion of the first semiconductor layer is configured to induce a lightly doped drain (LDD) region in the 2DEG channel.

26. The HEMT of claim 1, wherein
a portion of the first semiconductor layer is exposed through the recessed region, and
the exposed portion of the first semiconductor layer is configured to induce a lightly doped drain (LDD) region in the 2DEG channel.

27. The HEMT of claim 8, wherein the insulating layer extends continuously between the source and the drain.

28. The HEMT of claim 9, wherein the insulating layer extends continuously between the source and the drain.

29. The method of claim 18, wherein the insulating layer extends continuously between the source and the drain.

30. The method of claim 19, wherein the insulating layer extends continuously between the source and the drain.

* * * * *